United States Patent
Irscheid et al.

(10) Patent No.: US 7,672,397 B2
(45) Date of Patent: Mar. 2, 2010

(54) METHOD FOR PRODUCING A TRANSMISSION SIGNAL

(76) Inventors: Otmar Irscheid, Atc, 2nd floor, P.O. Box: 44558, Hawalli 32060 (KW); Andreas Langer, Krügerstr. 14, 85716 Unterschleissheim-Lohhof (DE); Michael Menge, Bellinzonastr. 1, 81475 München (DE)

( * ) Notice: Subject to any disclaimer, the term of this patent is extended or adjusted under 35 U.S.C. 154(b) by 645 days.

(21) Appl. No.: 10/514,574

(22) PCT Filed: May 14, 2003

(86) PCT No.: PCT/DE03/01571

§ 371 (c)(1), (2), (4) Date: Feb. 8, 2005

(87) PCT Pub. No.: WO03/096548

PCT Pub. Date: Nov. 20, 2003

(65) Prior Publication Data

US 2005/0152472 A1 Jul. 14, 2005

(30) Foreign Application Priority Data

May 14, 2002 (DE) .................... 102 21 390

(51) Int. Cl.
*H04L 25/49* (2006.01)

(52) U.S. Cl. .............. 375/297; 375/295; 375/296; 375/299; 375/316; 375/343; 455/126; 455/341

(58) Field of Classification Search .......... 375/297, 375/219, 295, 135, 136, 260, 145–147, 222, 375/255, 259, 292, 267, 299, 342, 343, 354, 375/355; 455/110, 126, 34
See application file for complete search history.

(56) References Cited

U.S. PATENT DOCUMENTS 6,313,703 B1 * 11/2001 Wright et al. ............... 330/149

(Continued)

FOREIGN PATENT DOCUMENTS

EP    1 168 601    1/2002

(Continued)

OTHER PUBLICATIONS

XP-010063100—Wright et al., "Experimental performance of an adaptive digital linearized power amplifier" Jun. 1992, pp. 1105-1108.

(Continued)

*Primary Examiner*—Shuwang Liu
*Assistant Examiner*—Hirdepal Singh
(74) *Attorney, Agent, or Firm*—McDonnell Boehnen Hulbert & Berghoff LLP

(57) ABSTRACT

A method for producing a transmission signal, wherein an input signal (Vd(t)), which is to be amplified, is fed to a power amplifier (PA) which outputs the signal in an amplified form (va(t)). A reproduction thereof is made and allocates a specific pre-distortion input signal (vd(t)) value to a specific input signal (vd(t)) value. A corresponding pre-distortion value is then determined for the input signal (vd(t)) and the corresponding pre-distortion value is applied to the input signal (vd(t)) in order to feed the pre-distorted input signal to the power amplifier (PA). Subsequently, the crest factor (CF) is calculated from the output signal (vd(t)) of the power (PA) and the reproduction or the value thereof if the determined crest factor departs from a predetermined range of values.

9 Claims, 1 Drawing Sheet

U.S. PATENT DOCUMENTS

| | | | |
|---|---|---|---|
| 6,438,360 B1 * | 8/2002 | Alberth et al. | 455/110 |
| 6,621,340 B1 * | 9/2003 | Perthold et al. | 330/149 |
| 6,741,661 B2 * | 5/2004 | Wheatley et al. | 375/296 |
| 6,794,936 B2 * | 9/2004 | Hsu et al. | 330/149 |
| 2002/0168016 A1 * | 11/2002 | Wang et al. | 375/260 |
| 2003/0207680 A1 * | 11/2003 | Yang et al. | 455/341 |

OTHER PUBLICATIONS

International Search Report and Written Opinion from International PCT Application No. PCT/US04/37820.

* cited by examiner

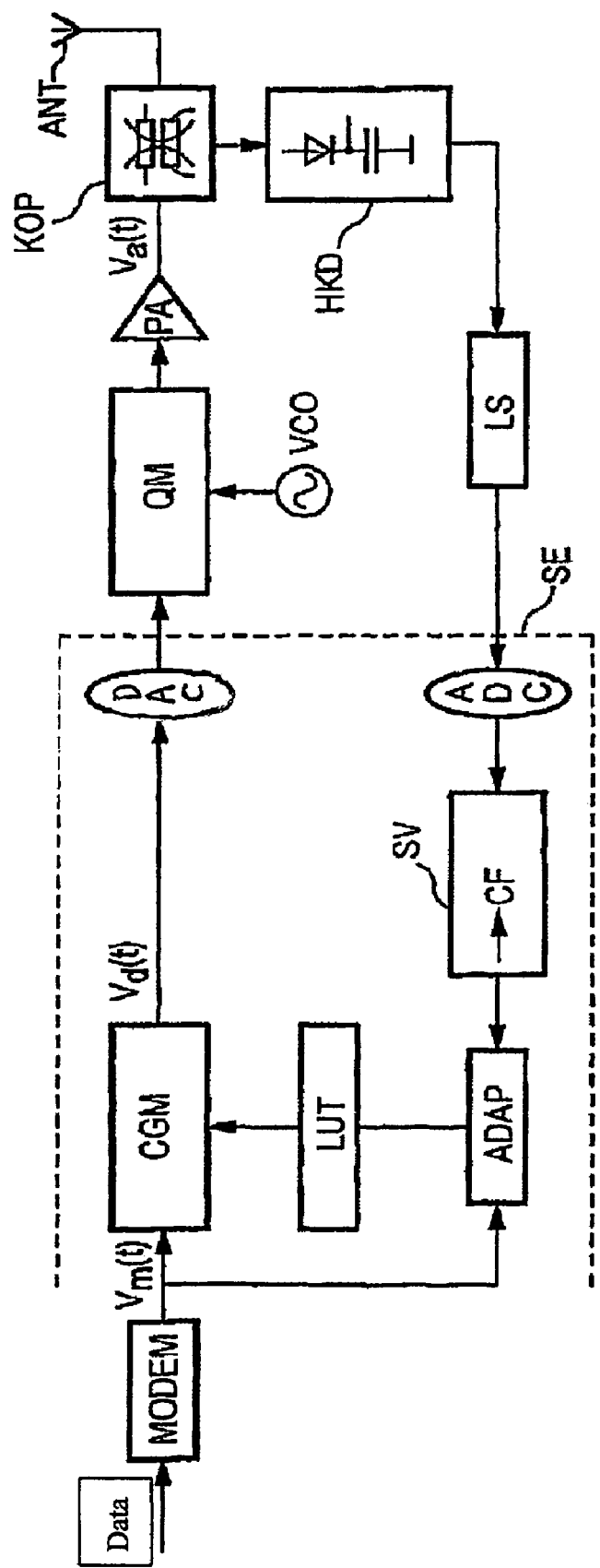

METHOD FOR PRODUCING A TRANSMISSION SIGNAL

BACKGROUND OF THE INVENTION

In numerous fields, there is a need for linear signal amplification exhibiting a high degree of power efficiency. An approach in keeping with this is to linearize the non-linear characteristic of a power amplifier (PA: Power Amplifier) by pre-distorting the signal in the digital baseband. However, the non-linearity keeps changing, for example, due to ageing and temperature-dependent components. With some methods, such as digital adaptive pre-distortion, the envelope of the transmitted signal has to be recovered with the aid of a feedback path, consisting, in particular, of a coupler, demodulator, and ADC (ADC: Analog-to-Digital Converter), as it is required for adaptation.

Classical pre-distortion employing coherent demodulation is hardware-intensive (since a complete receiving path is required), expensive and, in terms of energy consumption, inefficient especially in the mid-power range. Stringent demands are additionally placed on linearity in the feedback path and on determining the delay in the measured signal.

Because of the cited problems, no PA linearizing methods based on digital pre-distortion have, to date, been implemented in commercial mobile telephone systems (at least none are known).

The present invention seeks to provide a linear signal amplification that can be employed particularly in mobile radio arrangements such as mobile radio devices or mobile telephones.

SUMMARY OF THE INVENTION

The inventive method for producing a transmission signal wherein an input signal that is to be amplified is fed to a power amplifier which outputs the signal in an amplified form includes the following steps. A reproduction is made which allocates a specific pre-distortion input signal value to a specific input signal value or, as the case may be, amplitude. This type of reproduction or, as the case may be, allocation of corresponding pre-distortion values serves, in particular, to counteract non-linear amplification properties of the power amplifier and, thus, to achieve the required linearity of the amplification of the input signal or, as the case may be, of the input power. A corresponding pre-distortion value is furthermore determined for the input signal through the reproduction. The just-determined pre-distortion value is then applied to the input signal or, as the case may be, multiplied therewith in order to obtain a pre-distorted input signal which is finally fed to the power amplifier for amplification. A crest factor is then determined from the output signal of the power amplifier. If the determined crest factor is not within a predetermined range, the reproduction or, as the case may be, value will be adapted.

According to an embodiment, the reproduction or, as the case may be, its values or entries will be adapted in such a way that the values of the reproduction are recalculated, further that the new pre-distortion values (expressed more precisely, a new value corresponding to an input signal having a specific value or, as the case may be, amplitude) is applied to the input signal or, as the case may be, multiplied therewith, and that the pre-distorted input signal is finally fed to the power amplifier in order to newly determine the crest factor from the output signal of the power amplifier. The recalculation and the renewed application and determining of the crest factor from the output signal of the power amplifier continue being repeated until the determined crest factor is once more in the predetermined range.

Here, crest factor can be determined using digital signal processing equipment. It is advantageous, as explained in more detail below, if the output signal of the power amplifier is demodulated incoherently. The output signal of the power amplifier then can be digitized following incoherent demodulation and routed to the digital signal processing equipment. The output signal can be incoherently demodulated using an envelope-curve detector.

According to a further embodiment of the present invention, a circuit having the following components is provided for producing a transmission signal. The circuit has a power amplifier with an input for accepting an input signal which is to be amplified and which is outputted at an output of the power amplifier as an amplified output signal or, as the case may be, as the transmission signal. The circuit further has equipment for providing or, as the case may be, storing a reproduction which allocates a specific pre-distortion input signal value to a specific input signal value. Also provided is equipment for determining a corresponding pre-distortion value for the input signal and for applying the corresponding pre-distortion value to the input signal or, as the case may be, multiplying it with the input signal. Determining equipment determines a crest factor from the output signal of the power amplifier to which the previously pre-distorted input signal was fed. The reproduction or, as the case may be, its values or entries will then be adapted using adaptation equipment if the determined crest factor is outside a predetermined range.

According to another embodiment, the determining equipment may contain digital signal processing equipment for determining the crest factor. The circuit further may contain an envelope-curve detector for incoherently demodulating the output signal of the power amplifier. The circuit also may have an analog-to-digital converter for digitizing the demodulated output signal of the power amplifier in order to route the signal to the digital signal processing equipment.

According to a further embodiment of the present invention, a mobile radio arrangement is provided having a circuit of the above-described type for producing a transmission signal. The mobile radio arrangement may include, for example, a mobile radio device or, as the case may be, a mobile telephone.

The statistical properties of the modulated signal are altered by the AM/AM conversion of a power amplifier (which conversion relates to the correlation between the input and output amplitude or, as the case may be, input and output power). A major parameter with regard to signal statistics in the case of methods having a non-constant envelope is the crest factor CF. The crest factor describes the correlation between the maximum value and RMS (RMS: Root-Mean-Square) value of the modulating process. The crest factor is reduced in the saturation range of the PA by the AM/AM conversion (the signal is compressed). The change in the crest factor is a measure of the extent to which the power amplifier PA is operated in saturation. Thus, momentary crest factor is also a measure of adjacent channel transmission, determined substantially by AM/AM conversion. The correction of AM/PM conversion (relating to the function of the phase of the power amplifier's output signal in relation to the amplitude of the input signal) frequently can be dispensed with as it affects adjacent channel transmission less than the cited AM/AM conversion.

The crest factor very easily can be determined through DSP (Digital Signal Processing) after the output signal of the power amplifier PA has been coherently or incoherently demodulated. Incoherent demodulation, in particular, offers enormous cost-saving potential while at the same time being easy to implement. All that is required for this is an envelope-curve detector having adequate bandwidth whose output signal is digitized with the aid of an ADC. The crest factor is then calculated using digital signal processing equipment.

The characteristic curve of the power amplifier (PA characteristic curve for short) can be filed in the form of a parametric model (in a look-up table), with the parameters being adapted or, as the case may be, matched via the measured crest factor. Simulating the PA characteristic curve using the parametric model permits pre-distortion, such as parametric pre-distortion or complex gain pre-distortion, of an input signal of the power amplifier. Alongside ease of implementation, in particular, no part is played by the delay in the feedback path, which is one of the most difficult problems to resolve in the case of classical pre-distortion. The PA output signal is, in any event, often registered for the purpose of power regulation using a diode detector and digitized, which is to say that crest-factor-based pre-distortion is, in this case, possible with no additional hardware expenditure. It is only necessary to match the detector's bandwidth (through filtering in the baseband, for instance).

To summarize, it can be said that using the crest factor as the basis for adaptation in digital pre-distortion is a totally novel approach. Adaptive pre-distortion, based on determining the crest factor, is ideally suited for the mobile radio domain, in particular for mobile radio devices or, as the case may be, mobile telephones, as it is very easy to determine and because this process is not dependent on the delay in the feedback path.

Additional features and advantages of the present invention are described in, and will be apparent from, the following Detailed Description of the Invention and the Figures.

BRIEF DESCRIPTION OF FIGURES

FIG. 1 shows a schematic of the principle components for implementing the method according to the present invention.

DETAILED DESCRIPTION OF THE INVENTION

As already mentioned, the crest factor CF describes the correlation between the maximum value and RMS value of the modulating process. The statistical properties of the modulated signal are altered by AM/AM conversion of the power amplifier PA. The crest factor is reduced in the saturation range of the PA (the signal is compressed). The change in the crest factor is a measure of the extent to which the PA is operated in saturation. Thus, the momentary crest factor is also a measure of adjacent channel transmission, determined substantially by AM/AM conversion.

A circuit for producing a transmission signal according to a preferred embodiment will be explained in the following with the aid of FIG. 1.

Starting from left to right, data such as call data or video data is first fed to a modem (MODEM) in which it is digitized or, as the case may be, modulated. When the data has been processed, the modem outputs a corresponding signal vm(t), in the form of a digital baseband signal, which is finally to be converted into the RF (radio frequency) band and amplified in power. The signal vm(t) is, for this purpose, fed as a (non-distorted) input signal to a complex gain multiplier CGM. The (non-distorted) input signal vm(t) is multiplied therein as a function of its momentary amplitude with the associated complex value from a look-up table LUT. In the look-up table, a reproduction is provided which allocates a specific pre-distortion input signal (vm(t)) value to a specific input signal (vm(t)) value or, as the case may be, amplitude. The multiplied or, as the case may be, pre-distorted input signal vd(t) is then fed, after traversing a DA (digital-to-analog) converter DAC, to a quadrature modulator or, as the case may be, direct modulator QM designed to transform the signal directly or, as the case may be, convert it to the RF band. The quadrature modulator QM is connected for this purpose to a voltage-controlled oscillator VCO. The transformed input signal is then fed to an input of the power amplifier PA which amplifies the signal in power and outputs a corresponding output signal va(t). The output signal va(t) at the output of the power amplifier PA is fed as a transmission signal to coupling equipment KOP, such as a directional coupler, which feeds the signal to an antenna ANT and decouples a (small) portion thereof in order to feed this to a feedback path. The decoupled signal is first fed to an envelope-curve detector HKD (having sufficient bandwidth) for measuring the momentary power or, as the case may be, average power (RMS power). The envelope-curve detector HKD has a two-fold function here; namely, to reconstruct the envelope curve (larger bandwidth) and to determine the mean output power (smaller bandwidth). The different bandwidths of the envelope-curve detector HKD are achieved (via suitable baseband filtering) in the signal processing equipment SV, which will be explained later. The crest factor also can be determined there recursively and so does not require buffering of the sampled values.

Via a level shifter LS (which matches the level of the signal to the AD (Analog-to-Digital) converter ADC that follows) the signal then reaches a digital signal processing unit SE, indicated by the dashed-line framing. The signal from the level shifter LS is digitized in the digital signal processing unit SE by the AD converter ADC in order to be processed by the components that follow.

The digitized signal is then routed to the signal processing equipment SV by which, as already mentioned above, the crest factor is recursively determined. If the determined crest factor is not in a predetermined range, a corresponding signal will be sent to adaptation equipment ADAP which will then calculate new values or, as the case may be, entries or parameters for the reproduction contained in the look-up table. As such, new values or, as the case may be, parameters that are to be applied to an input signal having a specific amplitude will be calculated for the pre-distortion.

Adaptive pre-distortion can be effected via the crest factor obtained from the signal processing equipment SV, as is explained in more detail below.

Adaptation can be effected using different methods. FIG. 1 shows an implementation using a complex gain multiplier CGM already explained above. The (non-distorted) input signal vm(t) of the modem (MODEM) is multiplied as a function of its momentary amplitude with the associated complex value from the look-up table LUT.

The entries or, as the case may be, parameters in the look-up table LUT are then adapted or, as the case may be, matched with the aid of the crest factor CF determined by the signal processing equipment SV. If the determined crest factor CF is not in a predetermined range or, as the case may be, if the crest factor (CF) is below a predetermined threshold CFth, then it will be known from the correlation between the ACLR (ACLR: Adjacent Channel Leakage power Ratio) and crest factor CF that the ACLR requirements will not be met. New entries or, as the case may be, parameters for the reproduction in the look-up table LUT are calculated with the aid of an adaptation algorithm (in the adaptation equipment ADAP) and, after the new parameters have been applied to the input signal, the resulting crest factor CF is measured again. The adaptation process or, as the case may be, regulating process persists until the (currently) determined crest factor is again in the predetermined range or, as the case may be, is above the predetermined threshold (which is to say, until CF>CFth).

Coherent demodulation of the output signal of the power amplifier PA provides another possibility for acquiring the crest factor. However, the above-described incoherent demodulation (using an envelope-curve detector) offers enormous cost-saving potential while at the same time being easy to implement, the PA output signal being in any event often registered for the purpose of power regulation using a diode detector and digitized, which is to say that crest-factor-based pre-distortion is, in this case, possible with no additional hardware expenditure. Alongside ease of implementation, in particular, no part is played by the delay in the feedback path, which is one of the most difficult problems to resolve in the case of classical pre-distortion.

Although the present invention has been described with reference to specific embodiments, those of skill in the art will recognize that changes may be made thereto without departing from the spirit and scope of the present invention as set forth in the hereafter appended claims.

The invention claimed is:

1. A method for producing a transmission signal, wherein an input signal to be amplified is fed to a power amplifier which outputs the signal as an amplified output signal, the method comprising:
   making a reproduction which allocates a pre-distortion input signal value to a value of the input signal;
   determining the corresponding pre-distortion value for the input signal via the reproduction;
   applying the pre-distortion value to the input signal and feeding a resulting pre-distorted input signal to the power amplifier;
   generating an envelope-curve signal by incoherently demodulating the amplified output signal;
   determining a crest factor from the envelope-curve signal; and
   adapting the reproduction if the determined crest factor is not in a predetermined range, without respect to delay in a feedback path, wherein adapting the reproduction comprises:
   adjusting the reproduction to allocate a new pre-distortion input signal value to the value of the input signal;
   determining the corresponding pre-distortion value for the input signal via the adjusted reproduction;
   applying the re-determined pre-distortion value to the input signal;
   re-generating an envelope-curve signal by incoherently demodulating the new amplified output signal;
   re-determining the crest factor from the re-generated envelope-curve signal; and
   repeating the steps of adjusting, applying the re-determined predistortion, re-generating, and re-determining until the determined crest factor is in the predetermined range.

2. A method for producing a transmission signal as claimed in claim 1, wherein the crest factor is determined using digital signal processing equipment.

3. A method for producing a transmission signal as claimed in claim 2, wherein the envelope-curve signal is digitized and routed to the digital signal processing equipment.

4. A method for producing a transmission signal as claimed in claim 1, wherein the amplified output signal is incoherently demodulated using an envelope-curve detector.

5. A circuit for producing a transmission signal, comprising:
   a power amplifier having an input for accepting an input signal which is to be amplified and which is outputted at an output of the power amplifier as an amplified output signal;
   equipment for making a reproduction which allocates a pre-distortion input signal value to a value of the input signal; equipment for determining the pre-distortion value for the input signal and for applying the pre-distortion value to the input signal;
   demodulating equipment for incoherently demodulating the amplified output signal of the power amplifier;
   determining equipment for determining a crest factor from the incoherently demodulated amplified output signal of the power amplifier; and
   adaptation equipment for adapting the reproduction if the determined crest factor is not in a predetermined range, without respect to delay in a feedback path, wherein adapting the reproduction comprises the steps of:
   adjusting the reproduction to allocate a new pre-distortion input signal value to the value of the input signal;
   determining the corresponding pre-distortion value for the input signal via the adjusted reproduction;
   applying the re-determined pre-distortion value to the input signal;
   re-generating an envelope-curve signal by incoherently demodulating the new amplified output signal;
   re-determining the crest factor from the re-generated envelope-curve signal; and
   repeating the steps of adjusting, applying the re-determined predistortion, re-generating and re-determining until the determined crest factor is in the predetermined range.

6. A circuit for producing a transmission signal as claimed in claim 5, wherein the determining equipment includes digital signal processing equipment for determining the crest factor.

7. A circuit for producing a transmission signal as claimed in claim 6, wherein the demodulating equipment for incoherently demodulating the amplified output signal comprises an envelope-curve detector.

8. A circuit for producing a transmission signal as claimed in claim 6, further comprising an analog-to-digital converter for digitizing the demodulated amplified output signal of the power amplifier to route the demodulated amplified output signal to the digital signal processing equipment.

9. A mobile telephone, comprising a circuit for producing a transmission signal wherein the circuit further comprises:
   a power amplifier having an input for accepting an input signal which is to be amplified and which is outputted at an output of the power amplifier as an amplified output signal;
   equipment for making a reproduction which allocates a pre-distortion input signal value to a value of the input signal; equipment for determining the pre-distortion value for the input signal and for applying the pre-distortion value to the input signal;
   demodulating equipment for incoherently demodulating the amplified output signal of the power amplifier;
   determining equipment for determining a crest factor from the amplified output signal of the power amplifier after the amplified output signal is incoherently demodulated; and
   adaptation equipment for adapting the reproduction if the determined crest factor is not in a predetermined range, without respect to delay in a feedback path, wherein adapting the reproduction comprises the steps of:

adjusting the reproduction to allocate a new pre-distortion input signal value to the value of the input signal;
determining the corresponding pre-distortion value for the input signal via the adjusted reproduction;
applying the re-determined pre-distortion value to the input signal;
re-generating an envelope-curve signal by incoherently demodulating the new amplified output signal;
re-determining the crest factor from the re-generated envelope-curve signal; and
repeating the steps of adjusting, applying the re-determined predistortion, re-generating and re-determining until the determined crest factor is in the predetermined range.

* * * * *

UNITED STATES PATENT AND TRADEMARK OFFICE
CERTIFICATE OF CORRECTION

PATENT NO. : 7,672,397 B2 Page 1 of 1
APPLICATION NO. : 10/514574
DATED : March 2, 2010
INVENTOR(S) : Otmar Irscheid, Andreas Langer and Michael Menge It is certified that error appears in the above-identified patent and that said Letters Patent is hereby corrected as shown below:

Claim 1, column 5, line 50, delete "new".

Claim 5, column 6, line 26, delete "new".

Claim 9, column 7, line 8, delete "new".

Signed and Sealed this

Sixth Day of July, 2010

David J. Kappos
*Director of the United States Patent and Trademark Office*